United States Patent
Furuta

[11] Patent Number: 5,893,158
[45] Date of Patent: Apr. 6, 1999

[54] MULTIBANK DRAM SYSTEM CONTROLLED BY MULTIPLE DRAM CONTROLLERS WITH AN ACTIVE BANK DETECTOR

[76] Inventor: Minoru Furuta, Komayose 37-102, Ohba 5683-12, Fujisawa-shi, Kanagawa, Japan

[21] Appl. No.: 762,119

[22] Filed: Dec. 9, 1996

[30]  Foreign Application Priority Data

May 9, 1996 [JP] Japan .................................. 8-139590

[51] Int. Cl.⁶ ................................................ G06F 12/14
[52] U.S. Cl. ........................................ 711/150; 711/105
[58] Field of Search .................................. 711/131, 149, 711/105, 150

[56]  References Cited

U.S. PATENT DOCUMENTS

| | | | |
|---|---|---|---|
| 5,319,768 | 6/1994 | Rastegar | 711/131 |
| 5,465,344 | 11/1995 | Hirai et al. | 711/131 |
| 5,631,871 | 5/1997 | Park | 711/5 |
| 5,659,711 | 8/1997 | Sugita | 711/144 |
| 5,737,569 | 3/1996 | Nadir et al. | 711/149 |
| 5,745,913 | 8/1996 | Pattin et al. | 711/105 |

*Primary Examiner*—Tod R. Swann
*Assistant Examiner*—Christopher S. Chow
*Attorney, Agent, or Firm*—Helfgott & Karas, P C.

[57]  ABSTRACT

In the control of DRAM having a plurality of banks by a pair of memory controllers, a high rate operation is enabled by a pipeline control even during an exchange of the privilege to use a memory. Specifically, a system memory 11 having a plurality of banks is shared by a memory controller 12 and an external device 13 for pipeline control. Both the memory controller 12 and the external device 13 include a monitor circuit which monitors an address and a control signal delivered by the counterpart. When the privilege to use a memory is to be transferred, a bank which is currently active is examined, and such access is immediately allowed when the access is to a bank which is not active. When the access is to a bank which is currently active, a standby interval is provided, and the access is allowed after its transition to an inactive condition. A pipeline control is enabled even during a changeover of the privilege to use the memory, thus allowing a high rate operation of a computer system.

2 Claims, 6 Drawing Sheets

MULTIBANK DRAM SYSTEM CONTROLLED BY MULTIPLE DRAM CONTROLLERS WITH AN ACTIVE BANK DETECTOR

BACKGROUND OF THE INVENTION (a) Field of the Invention

The invention relates to a control system for a dynamic RAM (hereafter referred to as DRAM), and more particularly, to a control system for a DRAM in a computer system in which a system memory is shared by two control sections such as a memory controller and an external device, for example.

(b) Description of the Related Art

To increase the throughput for a read/write operation in DRAMs, a burst transfer mode is increasingly adopted, and proposals are made for DRAM having a plurality of banks. Examples of the proposed DRAM which have a plurality of banks and which are proposed as DRAMs of the next generation include a synchronous DRAM (hereafter referred to as SDRAM) and Rambus DRAM. These involve a pipeline control of the plurality of banks.

In an image display system which involves an image processing, for example, there is proposed a UMA technique (Unified Memory Architecture) in which a system memory such as DRAM is shared by a memory controller and an external device such as an image display unit. A method of controlling a DRAM in a system which employs a conventional UMA technique will be described below with reference to a block diagram shown in FIG. 5.

Figure 5:
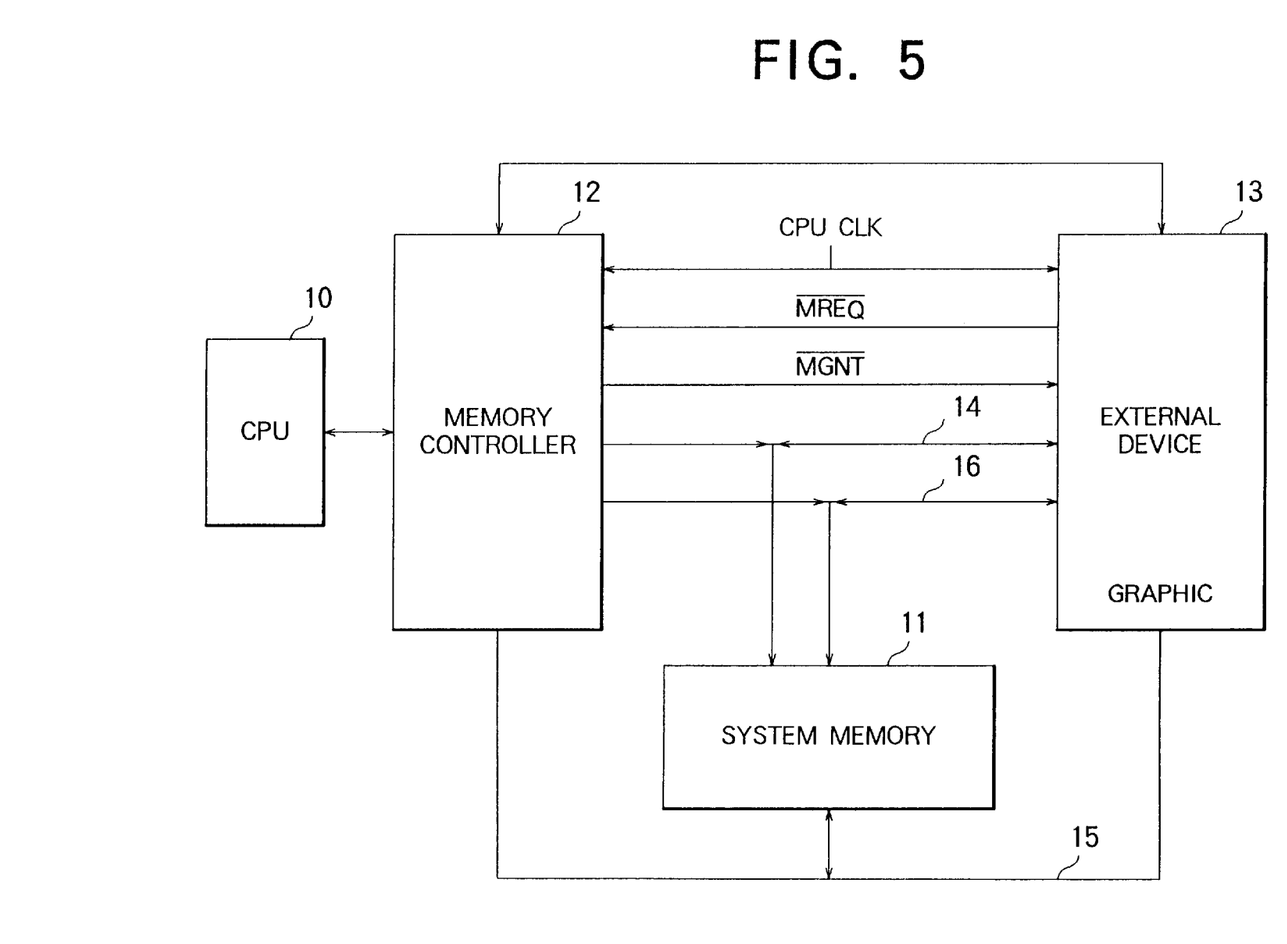
FIG. 5 is a block diagram of a conventional control system for DRAM.

A system memory 11 which is implemented by DRAMs is controlled by a memory controller 12 and an external device 13, each of which is controlled by CPU 10. The memory controller 12 and the external device 13 each controls the system memory 11 by feeding an address thereto through an address bus 14 and also feeding a control signal comprising XRAS (row address strobe; here XRAS stands for a top bar attached to RAS, and the character X is similarly applied in other occurrences), XCAS (column address strobe), XWE (write enable) and XOE (output enable) or the like through control signal lines 16, and transmits data to or receives data from the system memory 11 through a data bus 15. Both the memory controller 12 and the external device 13 transmit/receive a memory request signal XMREQ and a memory use grant signal XMGNT to determine which one of them has the privilege to use the system memory 11.

Figure 6:
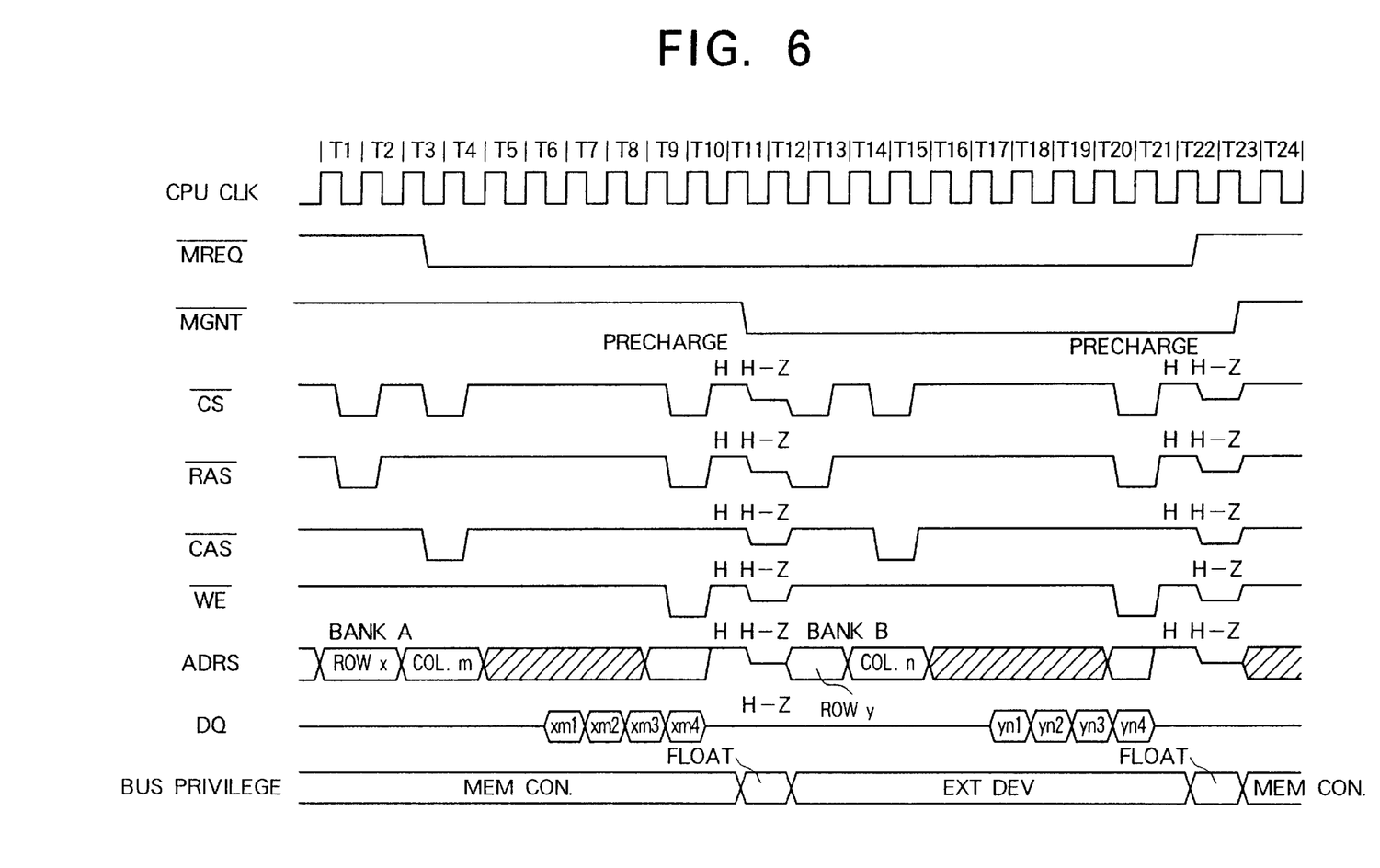
FIG. 6 is a series of timing charts illustrating an example of operation of the control system shown in FIG. 5.

FIG. 6 is a series of timing charts illustrating, as an example, signals appearing in a system which uses SDRAM and which employs the UMA technique. Upon reception of a memory request signal XMREQ from the external device, the memory controller which then has the privilege to use the memory either grants the use of the memory immediately whenever the memory controller is not using the system memory, or, if the system controller itself is using the system memory as illustrated in FIG. 6, establishes a floating (high impedance) state on the control signal lines and the address bus and activates the memory use grant signal XMGNT upon termination of its own access followed by the precharge operation. Thereupon the privilege to use the system memory is transferred to the external device, which is then enabled to access the system memory. FIG. 6 illustrates an example in which the memory controller reads data xm1–xm4 from the bank A of the system memory, followed by the external device reading data yn1–yn4 from the bank B of the system memory.

In the DRAM control system which operates according to the conventional UMA technique, whenever the privilege to use the system memory is changed, a pipeline operation which is then in progress is interrupted to exchange the privilege. When the privilege is exchanged, it is also necessary to provide a processing such as a precharge operation of the system memory, thus consuming a lot of time for the exchange. By way of example, FIG. 6 shows a situation in which after data xm1–xm4 is read out at time T10, the system must wait for until time T17 before next data yn1–yn4 can be read out. In this manner, a memory control system which has the current UMA technique requires a lot of time in exchanging the privilege to use the system memory, thus hindering to achieve a higher rate operation of a computer system. Accordingly, it is desired to provide a control system for DRAM in a system constructed by a UMA technique which is capable of reducing the time expended for the exchange, thereby enabling the achievement of a higher rate operation of the computer system.

SUMMARY OF THE INVENTION

In view of the foregoing, it is an object of the invention to provide a control system for a DRAM which reduces the time required in exchanging the privilege to use a system memory to thereby enable a higher rate operation of the computer system, in a system arrangement constructed by a UMA technique in which a memory controller and an external device, for example, share the system memory.

In accordance with the invention, there is provided a control system for DRAM comprising a first and a second memory controller which share a single DRAM having a plurality of banks, wherein at least one of the first and second memory controllers has: an access signal output unit for successively delivering an address signal and at least one control signal which controls a latching of the address signal in accordance with a clock signal; an active bank detector for detecting which one of the plurality of banks is currently active on the basis of an external signal input from the other of the first and second memory controllers; a comparator for comparing one of the banks which is detected to be active by the active bank detector and another of the banks including a memory cell which is to be accessed anew; and a control signal delay section for delaying an output of the control signal by a given time interval when a coincidence between the one and the another of the banks is detected by the comparator.

The method of controlling a DRAM according to the invention is not limited to the type of DRAM to which the invention is applied, but is preferably applicable to a type of DRAM, such as SDRAM, for example, having a plurality of banks and which is capable of a pipeline control.

The number of active bank detectors is preferably determined so as to correspond to the number of banks which become active simultaneously. In this manner, a duplicating access over all of the banks can be prevented. The number of banks which become active simultaneously depends on the rate of memory operation and a controlling method.

It is preferred that at least one of a first and a second memory controller includes, in addition to an active bank detector, a standby signal generator which predicts a time of transition of an active bank to its inactive condition and which generates a standby signal which causes a new access to be held in standby condition in the meantime. In this manner, a system operation takes place in a smooth manner during the changeover of the privilege to use the system memory.

With the control system for a DRAM according to the invention, a pipeline control takes place in a satisfactory manner during an exchange of the privilege for use between the first and the second memory controllers, thereby enabling a higher rate operation of the memory control. Accordingly, the invention achieves a higher rate operation of the computer system.

When CPU and an image display unit share a system memory, the privilege to use the system memory is exchanged frequently, and the controlling method for DRAM according to the invention can be utilized to advantage in such instance.

DESCRIPTION OF THE PREFERRED EMBODIMENTS

Figure 1:
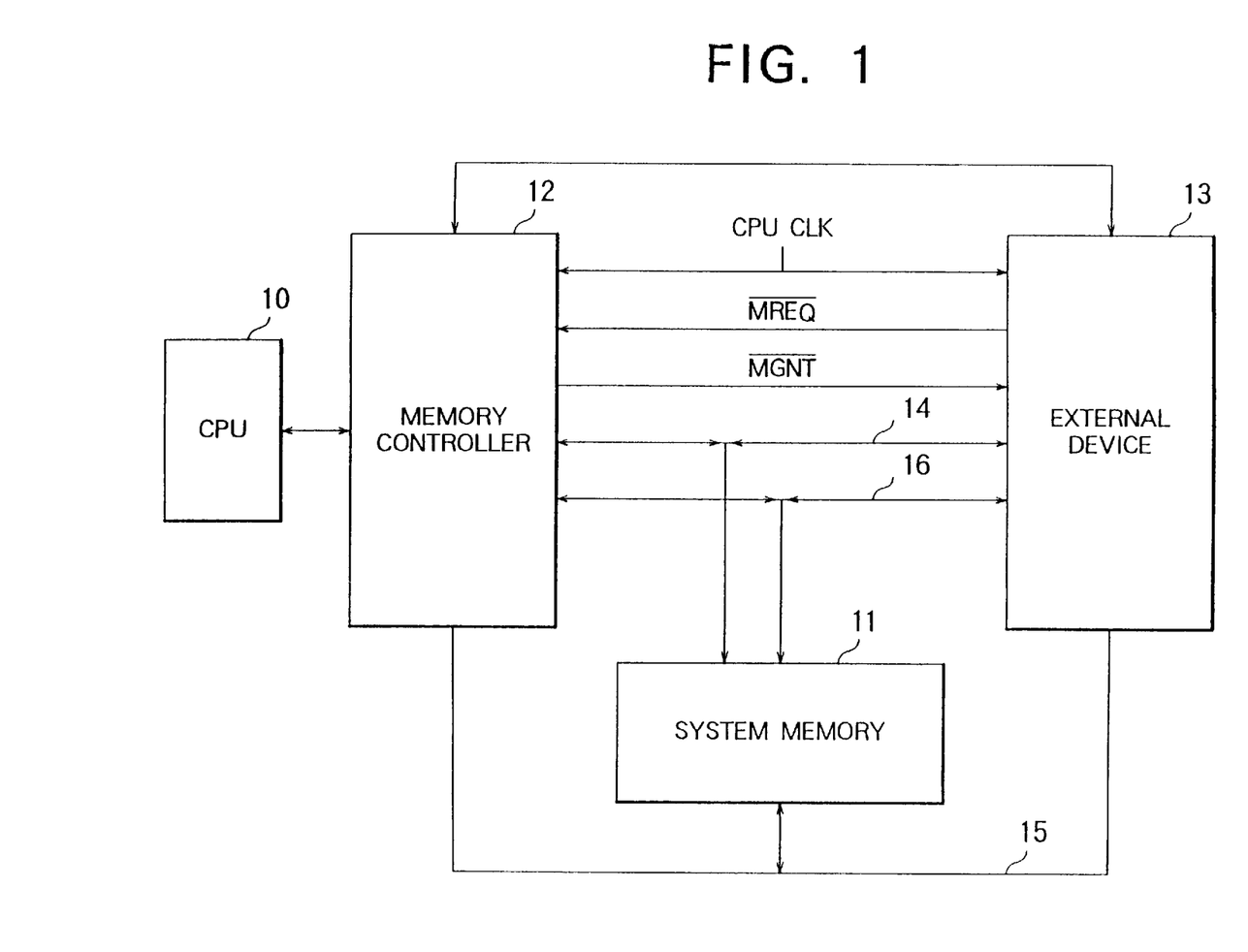
FIG. 1 is a block diagram of a control system for a DRAM according to an embodiment of the invention.

Referring to the drawings, a preferred embodiment of the invention will be described. FIG. 1 is a block diagram of a control system for a DRAM according to an embodiment of the invention. It is to be noted that in FIG. 1, similar parts are designated by corresponding reference characters as used in FIG. 5 in order to facilitate an understanding thereof.

The control system for a DRAM implementing the method according to the present embodiment comprises a CPU 10 which controls the entire system, a memory controller 12 and an external device 13, both controlled by the CPU, and a system memory 11. The external device 13 may be included in an image display unit, for example. The memory controller 12 and the external device 13 each controls the system memory 11 by feeding an address thereto through an address bus 14 and feeding control signals, which include XRAS (row address strobe; here XRAS stands for a top bar attached to RAS, and a character X is similarly used at other occurrences), XCAS (column address strobe), XWE (write enable) and XOE (output enable), through control signal lines 16, and transmits data to or receives data from the system memory 11 through a data bus 15. Both the memory controller 12 and the external device 13 transmit a memory request signal XMREQ and a memory use grant signal XMGNT to each other to determine in which one of them the privilege to use the system memory 11 lies. Such arrangement is similar to that in a conventional system.

The control signals which are fed from one of the memory controller 12 and the external device 13 to the system memory 11 are also fed to the other through the control signal lines 16 which constitute bidirectional signal lines, thereby allowing each of them to recognize the current status of the respective control signal. In addition, an address which is delivered from one of them is also input to the other, thereby allowing each of them to maintain a knowledge concerning a particular memory cell of a particular bank which is accessed by the counterpart.

Figure 2:
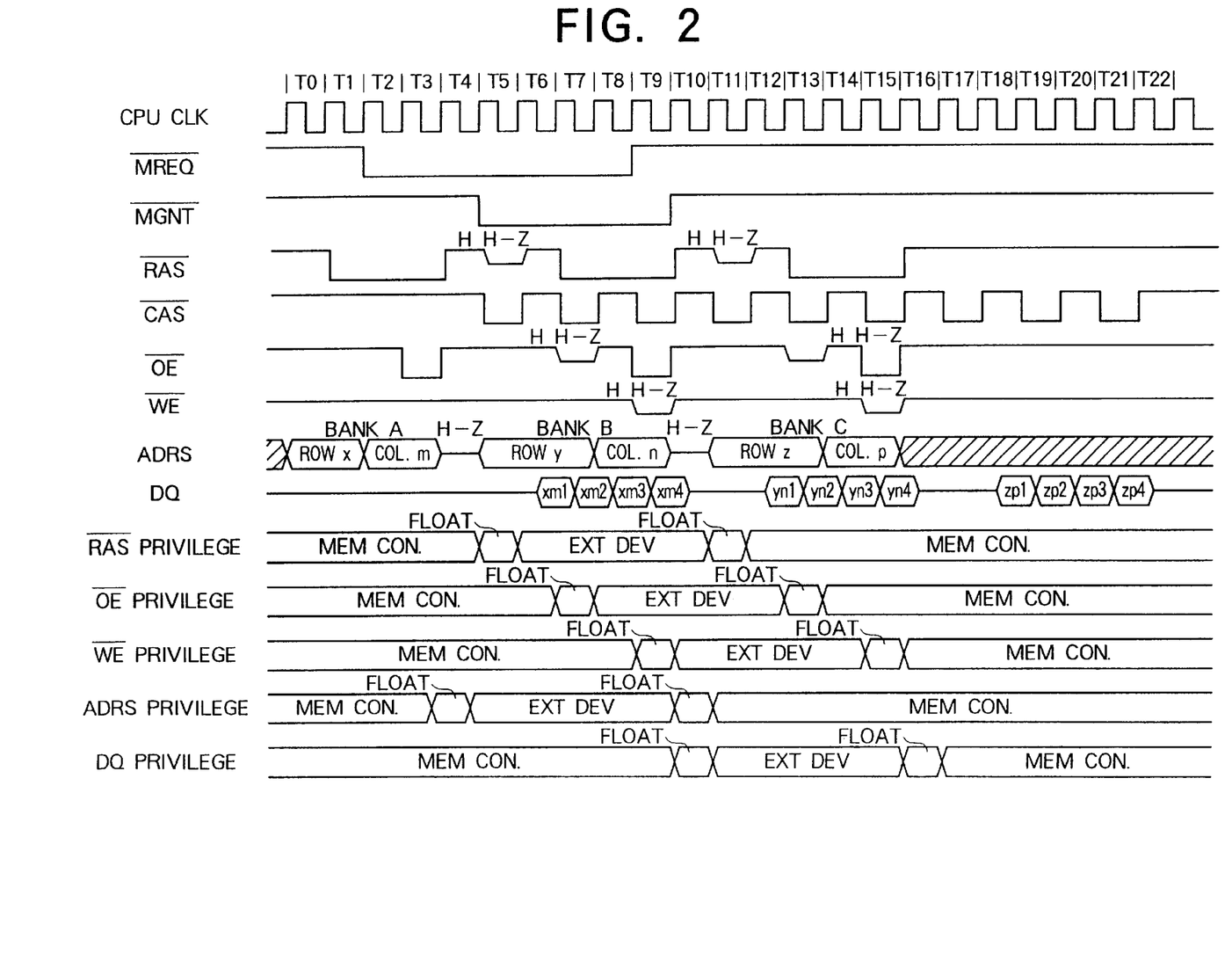
FIG. 2 is a series of timing charts illustrating an example of operation of the control system shown in FIG. 1.

FIG. 2 is a series of timing charts illustrating signals used in the system of the present embodiment. This Figure also indicates, for each of the address bus, the individual control lines (XRAS, XOE and XWE) and data bus DQ, either the memory controller or the external device to which the privilege belongs at a selected point of time, by legend "MEM CON" or "EXT DEV". Also, legend "FLOAT" indicates that the address bus or control signal line assumes a high impedance (floating) state.

In response to a command from CPU, the memory controller delivers an address for row x and column m within the bank A of the system memory onto the address bus, thus accessing a memory cell within the bank A. The external device delivers a demand to use the memory at time T2 by making the memory use request signal XMREQ active (namely, low level). The memory controller recognizes that the address bus is empty at time T3, and establishes a high impedance (H-Z) state on the address bus. At the same time, it makes the memory use grant signal XMGNT active, thus transferring the privilege to use the address bus at and subsequent to time T5 to the external device.

Further, the memory controller makes the row address strobe XRAS inactive at time T4, and establishes a high impedance state thereon at time T5, thus transferring the privilege to use XRAS at and subsequent to time T6 to the external device. It then establishes a high impedance state for XOE at time T7, thus transferring the privilege to use XOE at or subsequent to time T8 to the external device. In addition, the memory controller makes XWE inactive at time T8, and establishes a high impedance state thereon at time T9, thus transferring the privilege to use XWE at or subsequent to time T10 to the external device. The memory controller uses the data bus until time T10, and establishes a high impedance state thereon at time T11, thus transferring the privilege to use data bus at or subsequent to time T12 to the external device.

The external device knows that the bank B of the system memory which it intends to access has not been accessed by the memory controller, detects the high impedance state on the address bus at time T4, and delivers a request address for a memory cell within the bank B at the same time as the memory use grant signal XMGNT is made active at time T5. Subsequently, the external device makes XRAS active at time T7, and makes XOE active at time T9. XWE remains inactive since this is a read operation.

The row address for row y which is delivered onto the address bus from time T5 on is latched in response to the falling edge of XRAS at time T7, and the column address for column n is latched in response to the falling edge of XOE at time T9. Data yn1–yn4 from the memory cell which is specified in this manner by these addresses is read out into a read buffer at time T11 in response to the falling edge of XCAS which occurs after the falling edge of XOE, and is externally delivered in response to consecutive rising and falling edges of XCAS which occur subsequent to time T12. In this manner, the external device is capable of reading out data from the system memory by the pipeline control technique even when the privilege to use is exchanged.

The privilege to use each of the address bus ADRS, the control lines XRAS, XOE and XWE and the data bus DQ are successively transferred from the memory controller to the external device in the manner mentioned above, thereby allowing a pipeline control by the external device even during the exchange of the privilege to use the memory. In this example, after burst data xm1–xm4 are delivered to the memory controller, a delivery of burst data yn1–yn4 to the external device occurs with a vacancy of only two clock periods therebetween. This represents a substantial reduction as compared with a conventional practice according to the UMA technique in which a vacancy of seven clock periods (see FIG. 6) is required. Because the changeover of the bus occurs very frequently in the UMA technique, the resulting advantage is of great significance.

Although the external device is still accessing the bank B, it makes the memory use request signal XMREQ inactive at time T9, and then establishes a high impedance state on the address bus at time T10. It also makes XRAS inactive at time T10, and establishes a high impedance state thereon at time T11. In addition, it makes XOE inactive at time T12, and establishes a high impedance state thereon at time T13. Finally, it makes XWE inactive at time T14, and establishes a high impedance state thereon at time T15. In this manner, the privilege to use the address bus and the individual control signal lines is successively transferred to the memory controller.

The memory controller makes the use grant signal XMGNT inactive at time T10, and then delivers an address within the bank C at time T11 for a next access. Since the bank C has not been accessed during the previous access by the external device, it immediately delivers various control signals in order to read out data from the bank C. By successively transferring the privilege to use the address bus, the various control signal lines and the data bus between the memory controller and the external device, an interruption in the pipeline control does not occur.

Figure 3:
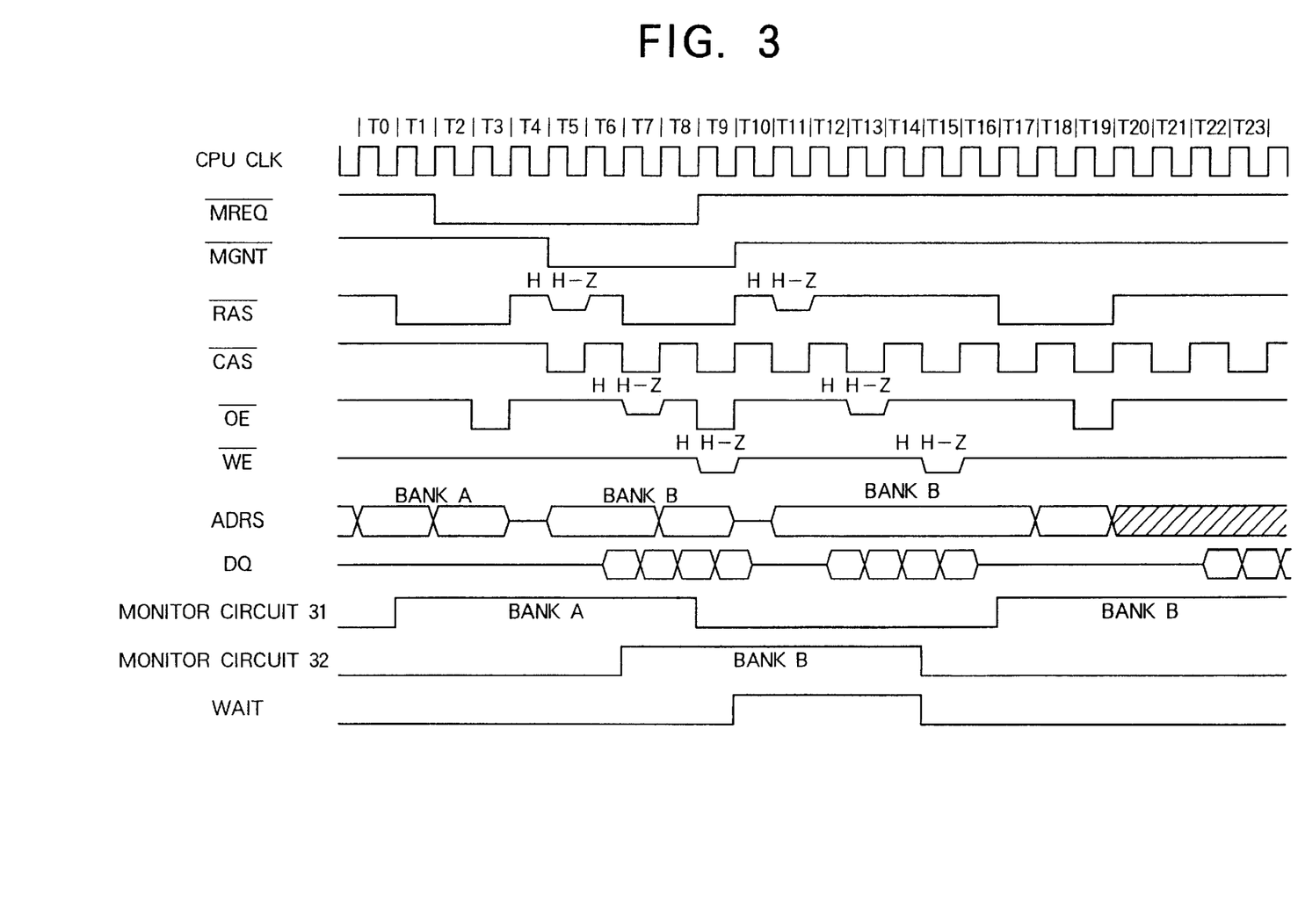
FIG. 3 is a series of timing charts illustrating another example of operation of the control system shown in FIG. 1.

FIG. 3 is a series of timing charts illustrating another example for the control system of the described embodiment. Referring to this Figure, up to time T10, memory cells within the bank A are accessed by the controller initially, followed by an access of memory cells within the bank B by the external device in the similar manner as in FIG. 2. However, in distinction to the example shown in FIG. 2, subsequently, an access of memory cells within the bank B is continued by the memory controller. The operation which occurs up to time T10 remains the same as before, and therefore will not be described in detail.

Each of the memory controller and the external device is provided with a standby signal generator which detects the occurrence of a new access to a bank which is currently active because of the access operation which is in progress and generates a standby signal which is utilized for avoiding a temporally overlapping access. When an address within the bank which is being accessed is accessed anew, the standby signal causes the timing of the new access to be delayed, thereby avoiding abuses which result from a duplicating access. As a result of employing such an arrangement, it is possible to provide a rapid pipeline control for which no standby signal is generated for a new access which does not involve an overlapping because a bank being accessed anew is different from a bank which is then active.

Figure 4:
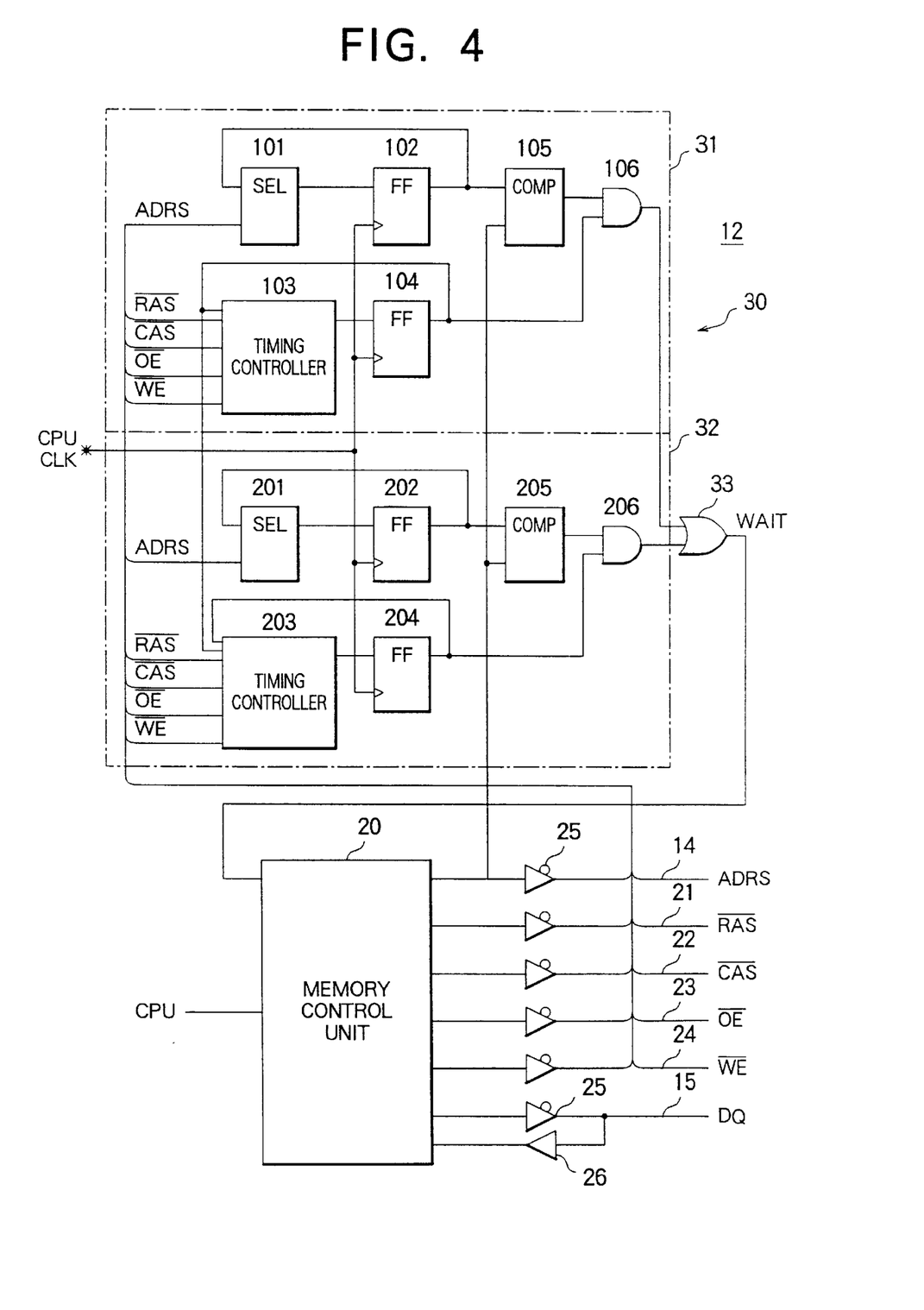
FIG. 4 is a block diagram of a memory controller used in the control system for DRAM shown in FIG. 1.

FIG. 4 is a block diagram of the memory controller 12 including the standby signal generator 30. A similar standby signal generator is also provided within the external device. The memory controller 12 includes a memory control unit 20 which has been used in a conventional DRAM control, and the standby signal generator 30. An address bus 14, a data bus 15 as well as control signal lines including XRAS line 21, XCAS line 22, XOE line 23 and XWE line 24 are connected to the memory control unit 20. The address bus 14, the data bus 15 and the control signal lines 21 to 24 are connected to the memory control unit 20 through respective three-state buffers 25, each of which is capable of establishing a high or low level or a floating state on each of the control signal lines. In addition, the memory control unit 20 is connected to the data bus 15 through a receiver 26, thus directly receiving data from DRAM.

The standby signal generator 30 comprises a plurality of bank monitor circuits 31 and 32, which are equal in number to the number of banks which can be active simultaneously, and an OR gate 33. While the provision of two bank monitor circuits 31, and 32 is illustrated in this example, the number of bank monitor circuits can be selected as required. It is generally understood that in order to operate a system memory at a higher rate, it is necessary to increase the rate of CPU clock which drives XCAS. In this instance, since it is difficult for the system memory to operate in following relationship with the clock, the number of clocks required to perform a memory access is increased, thus increasing the number of banks which become active simultaneously. Accordingly, the number of bank monitor circuits required also increases.

Each of the bank monitor circuits 31 and 32 comprises a selector 101 or 201 to which a particular bit or bits (for example, three bits) of the address bus is input which corresponds to a bank number, a first flip-flop 102 or 202 which receives an output from the selector and feeds it back to the selector to thereby store a particular bank being accessed, a timing control section 103 or 203 which receives control signals from the respective signal lines and latches them at a given timing, a second flip-flop 104 or 204 which is set/reset by an output from the timing control section to store a time interval required from a memory access to the completion of a precharge operation, a comparator 105 or 205 which responds to an input of a new address and compares it against a bank number which is stored in the first flip-flop 102 or 202, and an AND gate 106 or 206 which delivers a required standby interval whenever the comparator 105 or 205 detects a coincidence between the bank number of the new input and the currently active bank number. The outputs from both the bank monitor circuits 31 and 32 are ORed in OR gate 33 to be delivered as an input to the memory control unit 20.

In either the memory controller or the external device, if a bank which is currently active continues to be accessed, a standby interval is established in accordance with a standby signal WAIT which is derived by the standby signal generator 30. A series of control signals beginning with XRAS are successively delivered upon expiration of the standby interval. In the example shown in FIG. 3, it is shown that the start of an access is delayed by four clock periods because the same bank B is accessed consecutively. Specifically, it is shown that the monitor circuit 31 indicates that the bank A continues to be active from time T1 to time T8, that the monitor circuit 32 indicates that the bank B continues to be active from time T7 to time T14, and that an output from OR gate 33 or the standby signal (WAIT) continues from time T10 to time T14.

When the standby time expires at time T14, an access by the pipeline control is enabled. Initially, the next falling edge of XRAS occurs at time T17, allowing a row address to be latched, and the falling edge of XOE occurs at time T19, allowing a column address to be latched. Subsequently, an access of the bank B takes place in a manner similar to that mentioned before. In this instance, the fact that the bank B is active at this time instant is manifest at the output of the first bank monitor circuit 31.

As discussed, in the control system for a DRAM according to the present embodiment, a collation between a bank which is to be accessed anew and a bank which is then active is made by the bank monitor circuits, thus preventing an overlapping access to the same bank. In this manner, even when the privilege for use is exchanged between the controllers, an access by the pipeline control takes place while avoiding abuses which result from the overlapping access. In this manner, a higher rate operation of a DRAM is enabled. While not shown in FIG. 4, if a row address of a bank which is currently active remains to be the same as the row address for a bank which is to be accessed subsequently, it is unnecessary to make the standby signal (WAIT) active even when the bank which is currently active continues to be active.

While the invention has been described above in connection with a preferred embodiment, it should be understood that the method of controlling a DRAM according to the invention is not limited to the arrangement of the described embodiment, but that a method of controlling DRAM which includes a variety of changes and modifications applied to the embodiment is also contained within the scope of the present invention.

What is claimed is:

1. A control system for DRAM comprising a first and a second memory controller which share a single DRAM having a plurality of banks, wherein at least one of the first and second memory controllers has; an access signal output unit for successively delivers an address signal and at least one control signal which controls a latching of the address signal in accordance with a clock signal; an active bank detector for detecting which one of the plurality of banks is currently active on the basis of an external signal input from the other of the first and second memory controllers; a comparator for comparing one of the banks which is detected to be active by the active bank detector and another of the banks including a memory cell which is to be accessed anew; and a control signal delay section for delaying an output of the control signal by a given time interval when a coincidence between the one and the other of the banks is detected by the comparator.

2. A control system according to claim 1 wherein a number of active bank detectors is equal to the number of banks which become active simultaneously.

* * * * *